(12) United States Patent
Behel

(10) Patent No.: US 8,310,282 B2
(45) Date of Patent: Nov. 13, 2012

(54) APPARATUS AND METHOD FOR PROVIDING MULTI-MODE CLOCK SIGNALS

(75) Inventor: John Kevin Behel, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/098,109

(22) Filed: Apr. 29, 2011

(65) Prior Publication Data
US 2011/0210774 A1   Sep. 1, 2011

Related U.S. Application Data

(63) Continuation of application No. 12/606,142, filed on Oct. 26, 2009, now Pat. No. 7,961,014.

(51) Int. Cl.
*H03B 1/00* (2006.01)
*H03L 7/06* (2006.01)

(52) U.S. Cl. ........ 327/108; 327/112; 327/156; 327/291; 327/296; 326/87; 326/86

(58) Field of Classification Search .......... 326/86, 326/87, 83, 115, 121, 126, 127; 327/108, 327/112, 156, 291, 293, 296, 298
See application file for complete search history.

(56) References Cited

U.S. PATENT DOCUMENTS

| | | | |
|---|---|---|---|
| 6,437,599 B1 | 8/2002 | Groen | |
| 6,590,422 B1 | 7/2003 | Dillon | |
| 6,700,403 B1 | 3/2004 | Dillon | |
| 6,856,178 B1 * | 2/2005 | Narayan | 327/108 |
| 6,885,227 B2 * | 4/2005 | Agrawal et al. | 327/156 |
| 7,012,450 B1 * | 3/2006 | Oner et al. | 326/86 |
| 7,061,269 B1 * | 6/2006 | Agrawal et al. | 326/41 |
| 7,061,273 B2 | 6/2006 | Wang et al. | |
| 7,183,805 B2 | 2/2007 | Wang et al. | |
| 7,215,148 B1 * | 5/2007 | Johnson et al. | 326/83 |
| 7,248,079 B2 * | 7/2007 | Bhattacharya et al. | 326/83 |
| 7,397,270 B1 | 7/2008 | Luo et al. | |
| 7,535,258 B1 * | 5/2009 | Johnson et al. | 326/82 |
| 7,564,270 B1 * | 7/2009 | Zhang et al. | 326/127 |
| 7,609,097 B2 * | 10/2009 | Leonowich et al. | 327/108 |
| 2004/0246026 A1 | 12/2004 | Wang et al. | |
| 2006/0285702 A1 | 12/2006 | Felder | |

OTHER PUBLICATIONS

Dual Input Network Clock Generator/Synchronizer, Analog Devices, AD9549, Aug. 2007, 68 pages, available at http://www.analog.com/static/imported-files/Data_Sheets/AD9549.pdf.

High-speed transceiver logic, Wikipedia, Accessed on Aug. 13, 2009, at http://en.wikipedia.org/wiki/Hstl.

Altera Corporation, I/O Standard Specifications, HardCopy Series Handbook, vol. 1, Sep. 2007, p. 4-7 to 4-15.

(Continued)

*Primary Examiner* — Vibol Tan
(74) *Attorney, Agent, or Firm* — Knobbe Martens Olson & Bear LLP

(57) ABSTRACT

Apparatus and methods for providing multi-mode clock signals are disclosed. In some embodiments, a multi-mode driver configured to receive a first clock signal, and to selectively output a different clock signal in response to one or more signals from a controller is provided. The driver can include an H-bridge circuit without substantial increases in the size of the design area. Advantageously, lower jitter and improved impedance matching can be accomplished.

21 Claims, 16 Drawing Sheets

OTHER PUBLICATIONS

Interfacing LVDS to PECL, LVPECL, CML, RS-422 and single-ended devices. Application Note 47, Pericom, Feb. 6, 2002. 5 pages, available at www.pericom.com/pdf/applications/AN047.pdf.
Multiservice Clock Generator, Analog Devices, AD9551, Sep. 2009, 40 pages, available at http://www.alldatasheet.com/datasheet-pdf/pdf/300879/AD/AD9551.html.
Quad/Octal Input Network Clock Generator/Synchronizer, Analog Devices, AD9548, Apr. 2009, 112 pages, available at http://www.analog.com/static/imported-files/data_sheets/AD9548.pdf.
Reynoso, Interfacing PECL to LVDS, Application Brief 30, Pericom Semiconductor Corporation, Aug. 18, 1999, 2 pages, available at www.pericom.com/pdf/applications/AB030.pdf.

* cited by examiner $\Delta t1 > \Delta t2$

APPARATUS AND METHOD FOR PROVIDING MULTI-MODE CLOCK SIGNALS

CROSS-REFERENCE TO RELATED APPLICATIONS

This application is a continuation of U.S. patent application Ser. No. 12/606,142, filed Oct. 26, 2009, titled "APPARATUS AND METHOD FOR PROVIDING MULTI-MODE CLOCK SIGNALS," now U.S. Pat. No. 7,961,014, issued Jun. 14, 2011, the disclosure of which is hereby incorporated by reference herein.

BACKGROUND

1. Field

Embodiments of the invention relate to electronic devices, and more particularly, in one or more embodiments, to drivers for providing multi-mode clock signals for electronic devices.

2. Description of the Related Technology

Certain electronic systems use clock signals for various tasks. Each of these tasks may have individual specifications regarding the frequency and tolerances in logic thresholds. Some tasks may accommodate relaxed rise and fall times and be satisfied with approximate logic levels during operation, while others will require strict adherence to timing standards. Furthermore, some tasks employ different logic standards from other tasks. Examples of such different logic standards include low voltage differential signaling (LVDS), positive emitter-coupled logic (PECL), low-voltage positive emitter-coupled logic (LVPECL), and complementary metal-oxide-semiconductor (CMOS) logic.

In many of these electronic systems, such different tasks may need to be synchronized with one another. Thus, such electronic systems may generate a single master clock, and employ internal circuit logic to produce multiple clock signals based on the master clock for each of the various needs. This scheme generally requires additional circuitry to generate each of the varied clock signals.

FIG. 1 is a block diagram of an electronic system 100 in which multiple clock signals are produced for the operation of various components. The illustrated electronic system includes a master clock generator 101, a clock generator/distributor 103, and a plurality of components 105a-105d. In some embodiments, the electronic system 100 may form at least part of, for example, a wireless transmission/reception base station or an optical transmission system.

The master clock generator 101 generates a master clock signal CLK for the clock generator/distributor 103. The clock generator/distributor 103 cleans up and modifies the master clock signal CLK to produce a plurality of clock signals CLK1-CLKn, and supplies the clock signals CLK1-CLKn to the components 105a-105d of the system.

The clock signals CLK1-CLKn may be generally synchronized with the master clock signal CLK. However, one or more of the clock signals CLK1-CLKn may have a different frequency and/or voltage level from those of the master clock signal CLK, depending on the needs of the components 105a-105d that receive the clock signals CLK1-CLKn. Further, some of the clock signals CLK1-CLKn may have different frequencies and/or characteristics from one another, depending on the needs of the components 105a-105d.

Referring to FIGS. 2A-2C, various conventional configurations of a clock generator/distributor will be described as follows. FIG. 2A illustrates a clock generator/distributor 103a. The illustrated clock generator/distributor 103a serves to generate and distribute clock signals CLK1-CLKn. The clock generator/distributor 103a may include a phase-locked loop (PLL) 203, a plurality of clock dividers 201a-201d, and a plurality of drivers 202a-202d.

The phase-locked-loop (PLL) 203 is configured to receive a master clock signal CLK. The PLL 203 serves to produce a refined clock signal CLK_B with reference to the master clock signal CLK, and provide the refined clock signal CLK_B to the clock dividers 201a-201d. In certain embodiments, multiple phase-locked loop stages may be cascaded together within the clock generator/distributor 103a prior to providing a clock signal CLK_B to the dividers 201a-201d. In some embodiments, a first PLL may have a narrow loop bandwidth providing initial jitter cleanup of the input reference signal. A second PLL may have a frequency multiplying and/or dividing PLL that converts the first stage output frequency to a selected frequency. A skilled artisan will thus appreciate that various configurations of PLL can be used for the PLL 203.

Each of the clock dividers 201a-201d serves to divide the refined clock signal CLK_B into a clock signal that has the same or a lower frequency. For example, if the refined clock signal CLK_B has a frequency f, the clock dividers 201a-201d can generate clock signals having a frequency of, for example, f, f/2, f/4, or f/8. The clock dividers 201a-201d may provide their divided clock signals to the drivers 202a-202d.

The drivers 202a-202d may buffer the divided clock signals, and may also modify the characteristics of the divided clock signals. The drivers 202a-202d provide the buffered and/or modified clock signals CLK1-CLKn to various electronic components. In the context of this document, the amplified and/or modified clock signals CLK1-CLKn may be referred to as "component clock signals."

FIG. 2B illustrates another configuration for a clock generator/distributor 103b. The illustrated clock generator/distributor 103b serves to divide and distribute clock signals. The clock generator/distributor 103b includes an amplifier 205, a plurality of clock dividers 201a-201d, and a plurality of drivers 202a-202d.

The amplifier 205 is configured to receive and amplify (i.e. level shift) a master clock signal CLK, and provides a resulting clock signal CLK_B to the clock dividers 201a-201d. The configurations of the clock dividers 201a-201d and the drivers 202a-202d can be as described above in connection with FIG. 2A.

FIG. 2C illustrates another configuration for a clock generator/distributor 103c. The illustrated clock generator/distributor 103c serves to distribute and fan out clock signals having the same frequency. The clock generator/distributor 103c includes an amplifier 205 and a plurality of drivers 202a-202d, but does not include clock dividers. The amplifier 205 is configured to receive and amplify a master clock signal CLK, and provides an amplified master clock signal CLK_B to the drivers 202a-202d. Other details of the amplifier 205 and the drivers 202a-202d can be as described above in connection with FIG. 2B.

In some instances, a clock generator/distributor needs to provide different clock signals to various components of an electronic system. For example, the different clock signals may need to be in compliance with different logic standards that the components use. In such instances, one or more of the drivers of the clock generator/distributor may have different circuit configurations, each specified for a particular standard.

However, in certain instances, one or more of the drivers of a clock generator/distributor may have the same configuration that can be configured to provide such different clock signals. For example, each of the drivers can have the same circuit that is configurable to provide different clock signals in response to control signals. Such a driver may be referred to as a "multi-mode driver" in the context of this document.

Certain drivers for a clock generator/distributor are known to be configurable to provide clock signals complying with two or more of different logic standards, for example, low voltage differential signaling (LVDS), positive emitter-coupled logic (PECL), low-voltage positive emitter-coupled logic (LVPECL), and complementary metal-oxide-semiconductor (CMOS) logic.

SUMMARY

In one embodiment, an electronic device comprises a multi-mode driver configured to receive a first clock signal and to output a second clock signal at least partly in response to the first clock signal. The device also may include a controller configured to provide one or more control signals to the multi-mode driver, wherein the multi-mode driver comprises a circuit that is configured to selectively output one of different clock signals in response to the one or more control signals provided by the controller. The different clock signals may comprise one or more of a clock signal having characteristics in compliance with low voltage differential signaling (LVDS), a clock signal having characteristics in compliance with positive emitter-coupled logic (PECL) standard, a clock signal having characteristics in compliance with low-voltage positive emitter-coupled logic (LVPECL) standard, or a clock signal having characteristics in compliance with complementary metal-oxide-semiconductor (CMOS) logic standard. The different clock signals further comprise a clock signal having characteristics in compliance with High-Speed Transceiver Logic (HSTL) standard.

In another embodiment, an electronic device is disclosed comprising a first transistor, a second transistor, a third transistor, a fourth transistor, a fifth transistor, a sixth transistor, a seventh transistor, and an eighth transistor. The second transistor may be in series with a first resistor. The first transistor may be in parallel with the second transistor and first resistor in a first parallel circuit, the first parallel circuit further comprising an operational amplifier in connection with said first transistor. The eighth transistor may be in series with a second resistor and the seventh transistor may be in parallel with the second resistor and eighth transistor in a second parallel circuit. The third and fifth transistors may be in series, the fourth and sixth transistors may be in series, and the third and fifth transistors may be in parallel with the fourth and sixth transistors in a third parallel circuit. The first, second, and third parallel circuits may themselves be in series.

In another embodiment, an apparatus is disclosed comprising a switching circuit having a first biasing node and a second biasing node. The switching circuit may be configured to receive at least one clock signal as an input and to generate an output signal as an output. The circuit may further comprise a first biasing circuit coupled to a first biasing node and to a first voltage reference, wherein the first biasing circuit is configured to operate in at least a first mode or a second mode. The apparatus may also comprise a second biasing circuit coupled to the second biasing node and to a second voltage reference, wherein the second biasing circuit is configured to operate in at least the first mode or the second mode. In the first mode, the first biasing circuit and the second biasing circuit are configured to provide a low resistance current path such that an output impedance as seen by a load coupled to the output signal matches an intended load resistance to within 30%. In the second mode, the first biasing circuit and the second biasing circuits are configured as current sources.

In another embodiment, a method of biasing a switching circuit is disclosed, the method comprising providing a first selectable bias to a first biasing node of a switching circuit and providing a second selectable bias to a second biasing node of the switching circuit. The switching circuit may be configured to receive at least one clock signal as an input and to generate an output signal as an output. The method may also include selecting the first selectable bias and the second selectable bias to provide low resistance biases to the switching circuit for a first mode such that an output impedance as seen by a load coupled to the output signal matches an intended load resistance to within 30%. The method may further comprise selecting the first selectable bias and the second selectable bias to provide current source biases to the switching circuit for a second mode.

BRIEF DESCRIPTION OF THE DRAWINGS

The embodiments will be better understood from the Detailed Description of Embodiments and from the appended drawings, which are meant to illustrate and not to limit the embodiments.

DETAILED DESCRIPTION OF EMBODIMENTS

Figure 1:
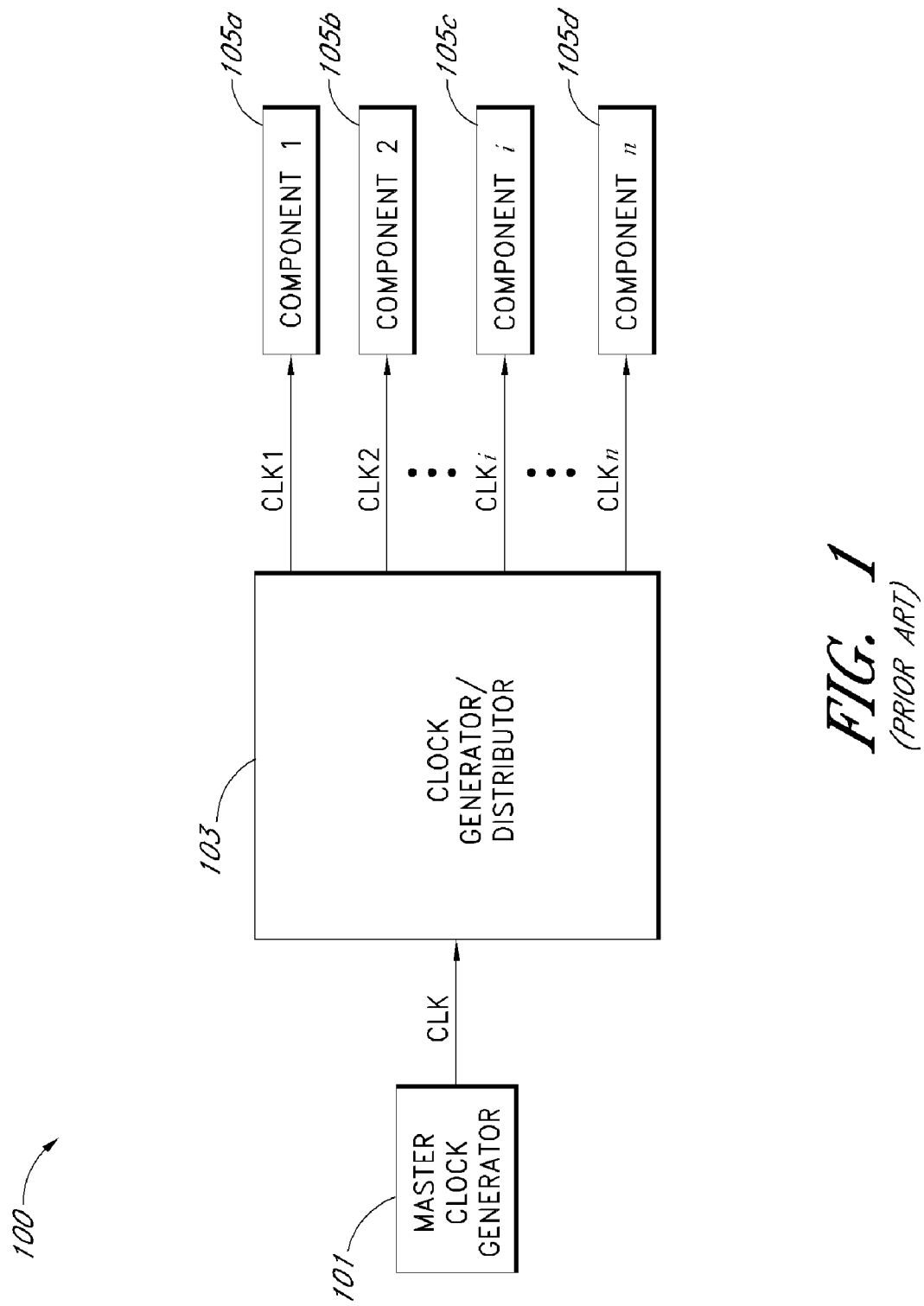
FIG. 1 is a block diagram illustrating an environment in which clock signals are used.

The following detailed description of certain embodiments presents various descriptions of specific embodiments of the invention. However, the invention can be embodied in a multitude of different ways as defined and covered by the claims.

In this description, reference is made to the drawings where like reference numerals indicate identical or functionally similar elements.

As components of electronic systems operate at high frequencies, it is necessary for multi-mode drivers to provide clock signals that minimize errors in high frequency operations of the components. One way of reducing errors is to minimize jitter in clock signals. Jitter generally refers to unfavorable dynamic changes in the edge location of a clock signal. For example, cycle-to-cycle jitter comprises changes in the edge location in each period.

In addition to jitter, impedance matching becomes also important for high-frequency applications. Where the impedance between the clock generator/distributor 103 and the components 105a-105d is poorly matched, voltage signals will reflect from the load, resulting in unfavorable interference with the clock signal.

Figure 3:
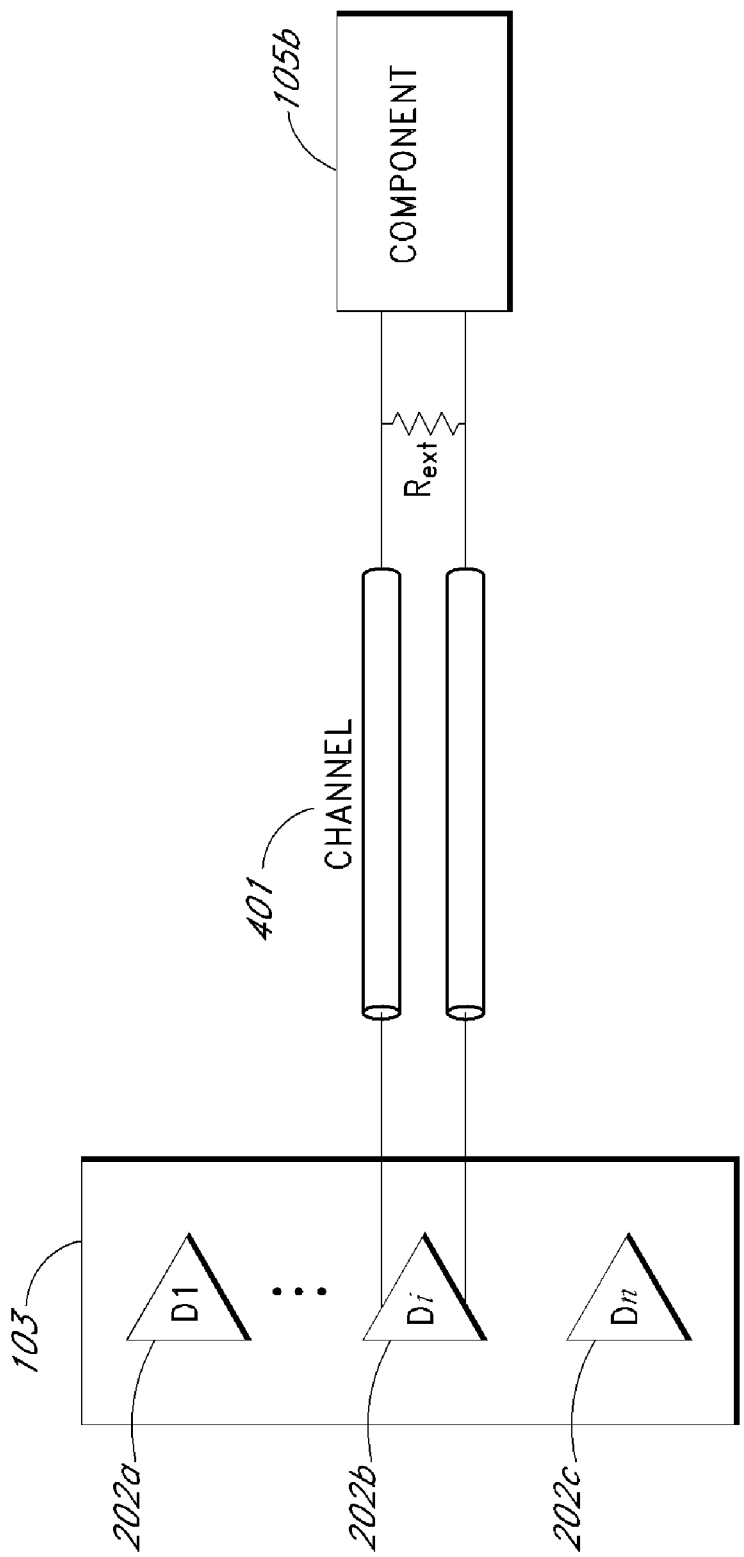
FIG. 3 is a block diagram illustrating one example of a clock generation/distribution device and a component of an electronic system connected by a channel.

FIG. 3 illustrates the impedance matching that needs to occur between a clock generator/distributor 103 and components 105a-105d (only 105b is shown for illustration purposes). With reference to only one of the components 105b, a channel 401 carries a signal from a driver 202b of the clock generator/distributor 103 to the component 105b. The termination $R_{ext}$ of the component 105b, as seen from the driver 202b, may result in signal reflections back across the channel 401 to the line driver 202b. Subsequent clock signals travelling from the driver 202b across the channel 401 may be distorted, thereby adversely affecting the operation of the component 105b.

In applications having poor impedance matching, clock signals from the driver 202b will be reflected back from the load $R_{ext}$. In clocking applications, this can be especially troublesome because the reflections may change the rise and fall times of the clock signal. Thus, components dependent upon the fast rise and fall times of the clock signal can be adversely affected.

Some logic standards, for example, LVDS, PECL, LVPECL, and CMOS logic, which can be provided by a multi-mode driver, are not always suitable for applications requiring low jitter. Therefore, there is a need for another standard that can minimize errors in high-frequency operations.

In one embodiment, a multi-mode driver can be configured to provide a clock signal that can provide a relatively fast rise time to minimize jitter. Having a fast rise time is advantageous in that it provides less time for noise from the components' 105b clock receiver to vary the proper timing of edge locations (i.e., the transitions from low to high, and vice versa, are displaced, at most, by a smaller amount).

Figure 4:
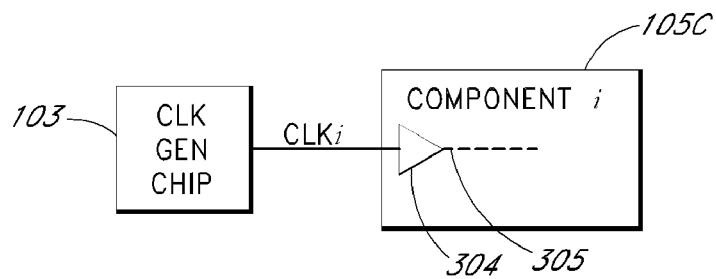
FIG. 4 is a diagram comprising graphs illustrating the relationship between jitter and rise time in relation to noise from the component.
Figure 4:
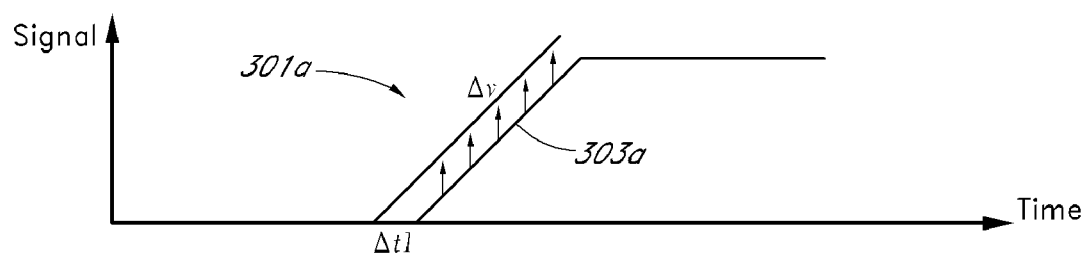
Figure 4:
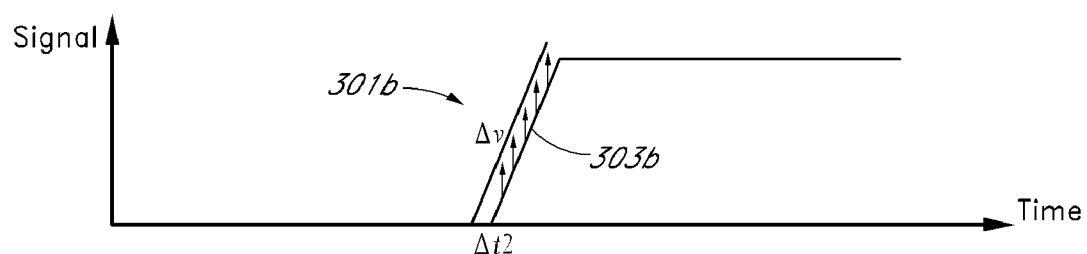

With reference to FIG. 4, clock generator/distributor 103 provides a clock signal Clki to the $i^{th}$ component 105c. Within the $i^{th}$ component is a receiver 304, which accepts the clock signal Clki and provides it to the component for use as signal 305. Waveforms 301a and 301b show two different clock signals as seen internally from the component at 305. Waveform 301a depicts the rise time for a typical clock signal with a shallow rise time. Waveform 301b, in contrast, depicts a signal having a much faster rise time. Time is expressed along a horizontal axis and the illustrated waveforms have the same scale.

Voltage noise 302 is from the receiver 304. These fluctuations in voltage 302 can translate into noise displacements 303a in the clock signal. These displacements distort the clock signal, causing the minimum low voltage and the maximum peak values to be reached sooner or later than was intended. Under noisy conditions, a receiver 304 monitoring the signal would erroneously determine that the clock edge had occurred at this undesired time. This process repeats on every clock edge, typically with a random pattern of cycle-to-cycle jitter as a result of random noise.

In contrast to the shallow rise time of graph 301a, graph 301b has a much steeper ascent and descent at the end of each cycle. While noise displacements 303b have the same width as the noise displacements 303a, there is less time for their distortion to influence the edge location of the clock signal. Accordingly, a more accurate signal results and the observed completion of the cycle more closely comports with the intended termination time.

A multi-mode driver can be configured to provide a clock signal that can be compatible with High-Speed Transceiver Logic (HSTL) standard. In some instances, the clock signal can be a differential clock signal(s). In the context of this document, such a clock signal can be referred to as an "HSTL clock signal" or a "clock signal in HSTL mode." Certain characteristics of an HSTL clock signal are shown in Table 1 below. In addition, the characteristics of clock signals according to other modes are also provided in Table 1. A skilled artisan will appreciate that the characteristics of the HSTL clock signal may not be identical to those of clock signals specified by a certain industry standard that is titled "HSTL standard."

TABLE 1

| Parameter | PECL | LVPECL | LVDS | CMOS | HSTL |
|---|---|---|---|---|---|
| $V_{CC}$ | 5 | 3.3 | — | 5, 3.3, 1.8 | 5, 3.3, 1.8 |
| $V_{OH}$ | $V_{CC}$ − 1.025 to $V_{CC}$ − 0.88 | $V_{CC}$ − 1.025 to VCC − 0.88 | <1.475 V | $V_{CC}$ − 0.1 | $V_{CC}$ * 0.75 |
| $V_{OL}$ | $V_{CC}$ − 1.81 to $V_{CC}$ − 1.62 | $V_{CC}$ − 1.81 to $V_{CC}$ − 1.62 | >0.925 | 0.1 | $V_{CC}$ * 0.25 |
| Differential Output Voltage $V_{PP}$ | 800 mV | 800 mV | 250 mV-450 mV | — | $V_{CC}/2$ |
| Output Common Mode Voltage $V_{OS}$ | $V_{CC}$ − 1.3 | $V_{CC}$ − 1.3 | 1.25 | — | $V_{CC}/2$ |

As seen from Table 1, PECL and LVPECL are supply referenced and thus $V_{OH}$ and $V_{OL}$ are specified relative to $V_{CC}$. PECL and LVPECL differ from one another in the level of supply voltage used. LVDS does not specify a supply voltage, but rather directly specifies the output common mode voltage $V_{OS}$. $V_{CC}$ refers to the source voltage used throughout the circuit. $V_{OH}$ refers to the minimum voltage level that will comprise a logic high. $V_{OL}$ is the maximum voltage level that will comprise a logic low. The Differential Output Voltage $V_{PP}$ refers to the peak to peak voltage, i.e. the differential between $V_{OH}$ and $V_{OL}$. The Output Common Mode Voltage $V_{OS}$ refers to the average voltage level of the two differential signals (i.e., $(V_{OH}-V_{OL})/2$ for the implementation).

Thus, such a multi-mode driver can provide an HSTL clock signal that can provide a fast rise time. Further, the multi-mode drivers can also be configured to match the output impedance of the driver to the impedance of the load during an HSTL mode. This matching reduces reflections, improving signal integrity and the rise/fall times in clocking applications.

Figure 2A:
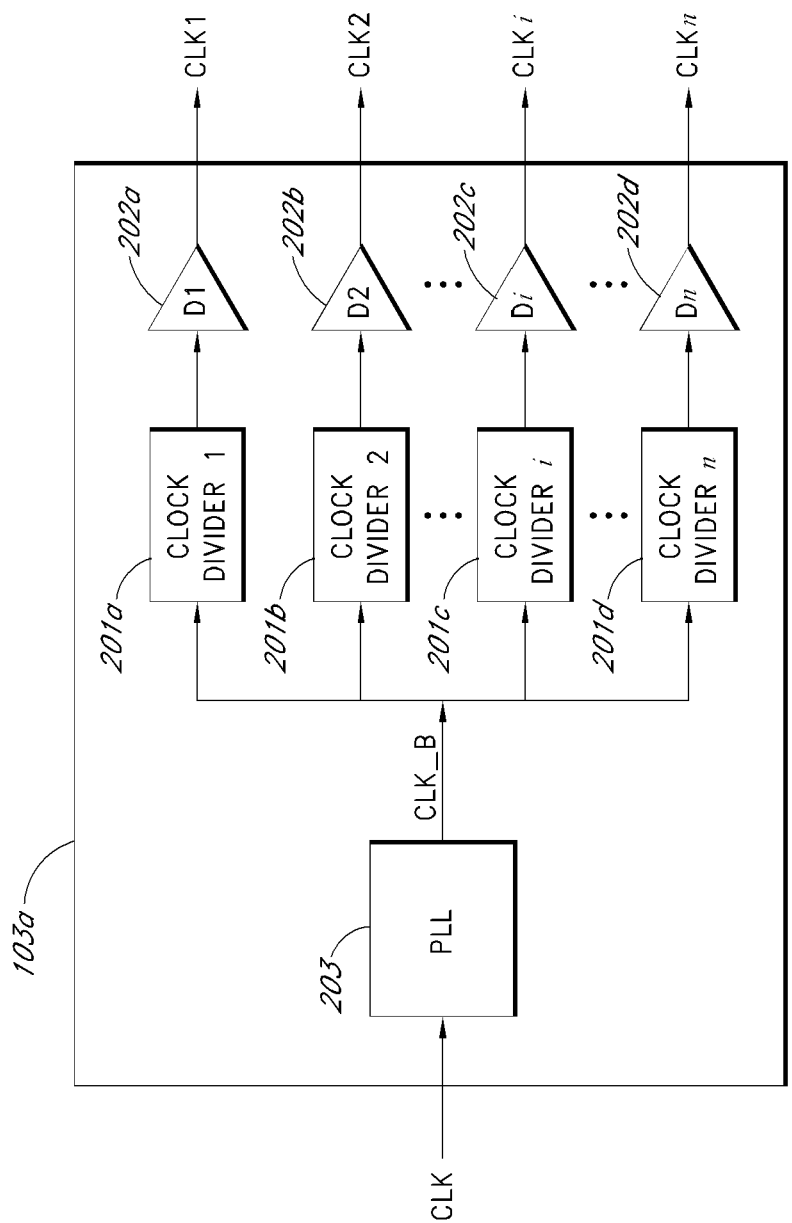
FIG. 2A is a block diagram illustrating a conventional clock generation/distribution circuit.
Figure 5:
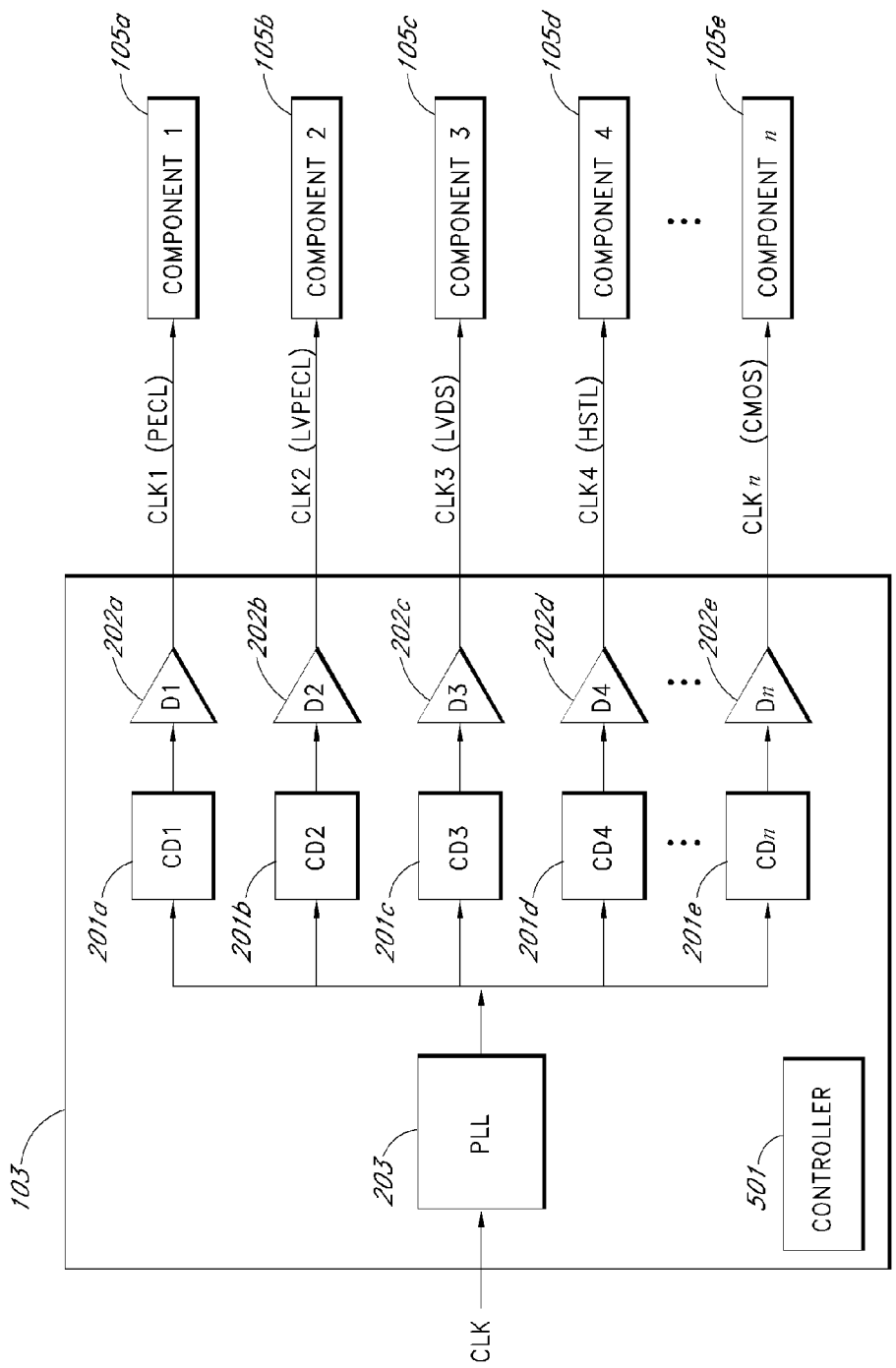
FIG. 5 is a block diagram illustrating an electronic system including a clock generation/distribution device generating multi-mode clock signals according to some embodiments.

Referring to FIG. 5, in some embodiments, a clock generator/distributor 103 can include a PLL 203, a plurality of clock dividers 201a-201e, a plurality of drivers 202a-202e, and a controller 501. The details of the PLL and the clock dividers 201a-201e can be as described above in connection with FIG. 2A. The controller 501 can control the operations of each of drivers 202a-202e, including, but not limited to, satisfying the requirements of the respective components 105a-105e.

At least one of the drivers 202a-202e can have a circuit that can be configured to provide a HSTL mode clock signal as well as one or more of clock signals in compliance with LVDS, PECL, LVPECL, and CMOS logic levels.

However, a multi-mode driver providing the HSTL mode in parallel with other modes, for example, in parallel with one or more of LVPECL, PECL, LVDS, and CMOS modes, can use significantly more chip area than devices without HSTL. Furthermore, the additional circuitry can increase the loading on the output nodes, adversely affecting the accuracy of clock signals. Similarly, placing additional resistors or large switching devices to permit HSTL mode can result in unwanted voltage drops or increased capacitance in the other modes. Further, to retain compatibility with LVPECL, and the DC coupling used with LVPECL and LVDS, it is desirable not to omit the previous modes when providing HSTL functionality in a single multi-mode driver. Thus, there is a need for a circuit for such a driver that can provide a HSTL mode in addition to other modes while minimizing the additional circuit area used.

Circuit For Multi-Mode Driver

Figure 2B:
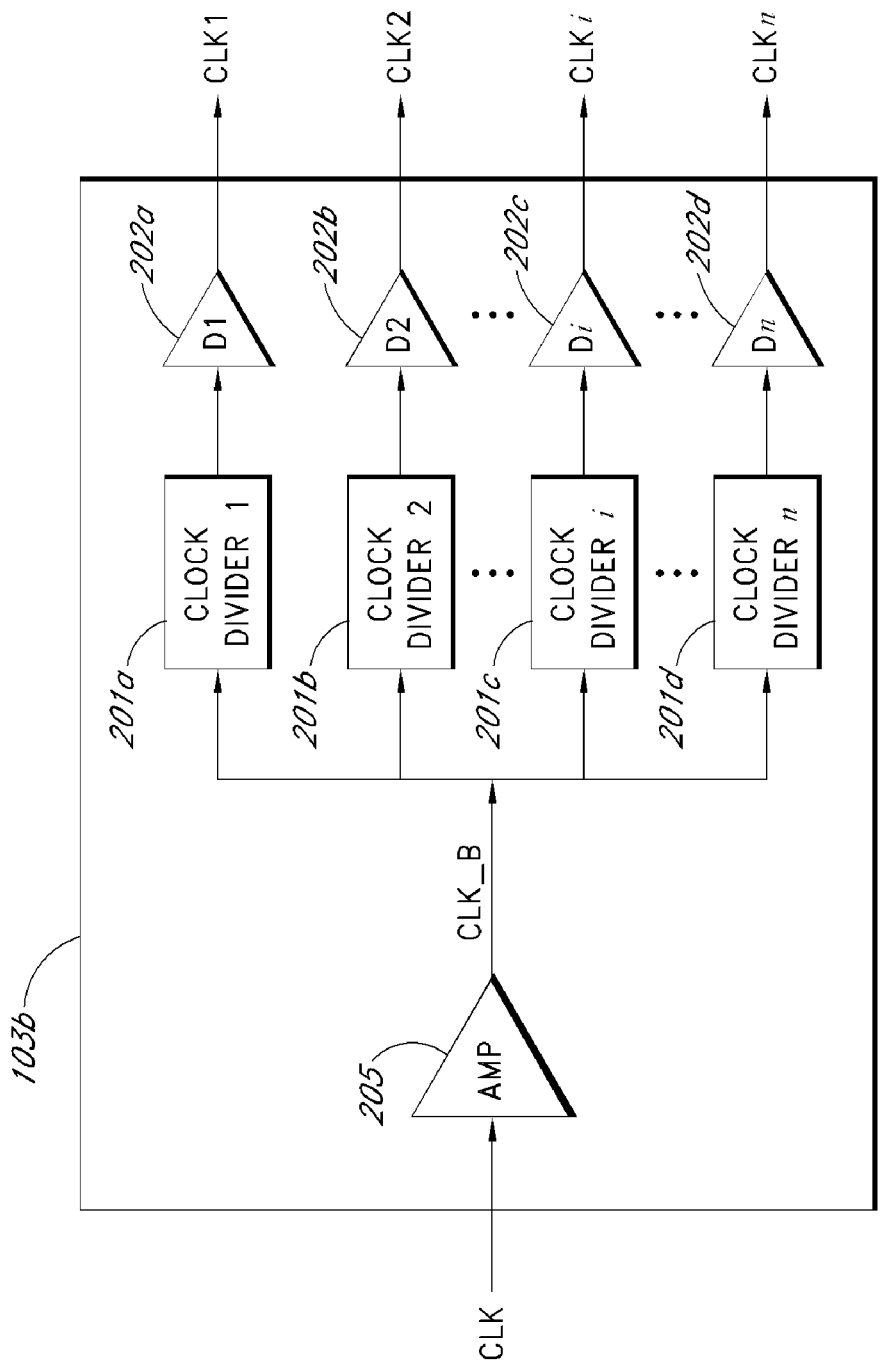
FIG. 2B is a block diagram illustrating a conventional clock division/distribution circuit.
Figure 2C:
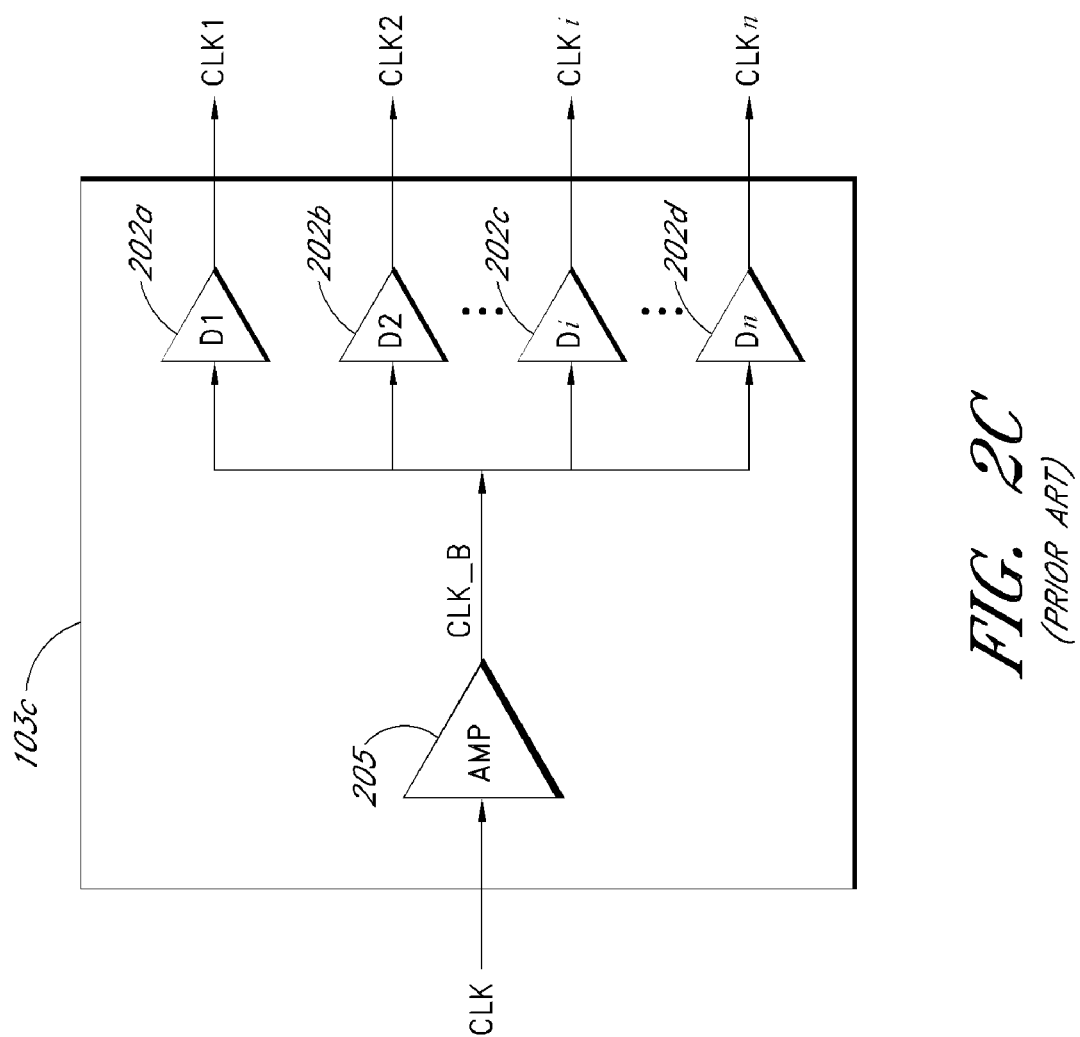
FIG. 2C is a circuit diagram illustrating a conventional clock distribution/fan-out circuit.
Figure 6:
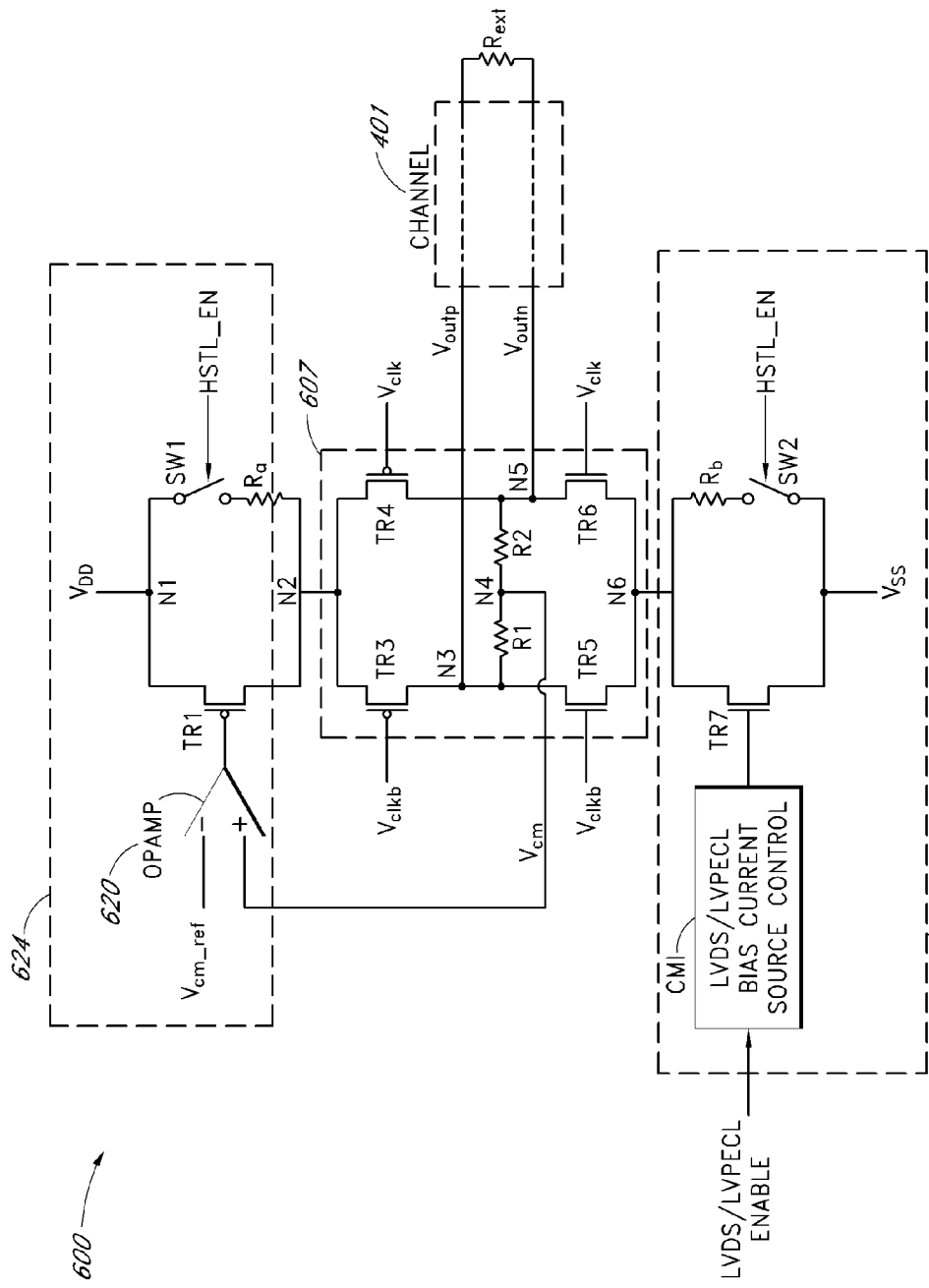
FIG. 6 is a circuit diagram illustrating a driver circuit for a clock generation/distribution device generating multi-mode clock signals according to one embodiment.

Referring to FIG. 6, one embodiment of a multi-mode driver circuit will be described below. The illustrated driver circuit 600 is configured to provide several modes of operation (LVPECL, LVDS, HSTL). The circuit 600 can be at least part of at least one of the drivers 201a-201d described above in connection with FIGS. 2A to 2C or at least one of the drivers 201a-201e described above in connection with FIG. 5.

The illustrated driver circuit 600 includes first, third, fourth, fifth, sixth, and seventh transistors TR1, TR3, TR4, TR5, TR6, TR7, a first switch SW1, and a second switch SW2. The circuit 600 also includes a first and second resistors R1, R2, and a first and second switch resistors $R_a$, $R_b$. The circuit 600 further includes an operational amplifier OPAMP, a LVDS/LVPECL bias current source controller CM1, and first to sixth nodes N1-N6.

In the illustrated embodiment, the first transistor TR1 is a PMOS transistor. The first transistor TR1 includes a source/drain coupled to a first voltage source $V_{DD}$, a drain/source coupled to the second node N2, and a gate configured to receive an output signal from the operational amplifier OPAMP. A skilled artisan will appreciate that the first transistor TR1 can alternatively be an NMOS transistor or other types of transistors, depending on the configuration of the circuit (and inputs to the OPAMP may need to be swapped).

In the illustrated embodiment, the third transistor TR3 is a PMOS transistor. The third transistor TR3 includes a source/drain coupled to the second node N2, a drain/source coupled to the third node N3, and a gate configured to receive an inverted clock signal $V_{clkb}$ from, for example, a clock divider 201a-201e (FIG. 5). $V_{clkb}$ may refer to a clock signal inverted from any of the clock signals CLK or CLK_B from FIGS. 1, 2A-C depending on the particular embodiment. A skilled artisan will appreciate that the third transistor TR3 can be an NMOS transistor or other type of transistor, depending on the design of the circuit.

In the illustrated embodiment, fourth transistor TR4 is a PMOS transistor. The fourth transistor TR4 includes a source/drain coupled to the second node N2, a drain/source coupled to the fifth node N5, and a gate configured to receive the clock signal $V_{clk}$ from, for example, a clock divider (FIG. 5). $V_{clk}$ may refer to a clock signal inverted from any of the clock signals CLK or CLK_B from FIGS. 1, 2A-C depending on the particular embodiment. A skilled artisan will appreciate that the fourth transistor TR4 can be an NMOS transistor or other type of transistor, depending on the design of the circuit.

In the illustrated embodiment, the fifth transistor TR5 is an NMOS transistor. The fifth transistor TR5 includes a source/drain coupled to the third node N3, a drain/source coupled to the sixth node N6, and a gate configured to receive the inverted clock signal $V_{clkb}$. A skilled artisan will appreciate that the fifth transistor TR5 can be a PMOS transistor or other type of transistor, depending on the design of the circuit.

In the illustrated embodiment, the sixth transistor TR6 is an NMOS transistor. The sixth transistor TR6 includes a source/drain coupled to the fifth node N5, a drain/source coupled to the sixth node N6, and a gate configured to receive the clock signal $V_{clk}$. A skilled artisan will appreciate that the sixth transistor TR6 can be a PMOS transistor or other type of transistor, depending on the design of the circuit.

In the illustrated embodiment, the seventh transistor TR7 is an NMOS transistor. The seventh transistor TR7 includes a source/drain coupled to the sixth node N6, a drain/source coupled to the second voltage source $V_{SS}$, and a gate configured to receive a control signal from the current source controller CM1. A skilled artisan will appreciate that the seventh transistor TR7 can be a PMOS transistor or other type of transistor, depending on the design of the circuit.

In the illustrated embodiment, the common-mode voltage controlling transistor is coupled to $V_{DD}$ and the current source is coupled to $V_{ss}$. Typically, current sources have high impedance characteristics. In an alternative embodiment one might consider exchanging the positions of current source CM1 and op-amp OPAMP, such that the OPAMP is output to the gate of transistor TR7 and the current source CM1 is output to the gate of transistor TR1. One skilled in the art would readily recognize similar configuration variations that will achieve the same modes of operation.

The first switch SW1 includes a first terminal coupled to the first voltage source $V_{DD}$, and a second terminal coupled to the switch resistor $R_a$. The first switch SW1 is configured to switch on or off at least partly in response to an HSTL enable signal from a controller, for example, the controller 501 of FIG. 5. Operation will be described later in connection with FIGS. 8A-9B.

The second switch SW2 includes a first terminal coupled to switch resistor $R_b$, and a second terminal coupled to the second voltage source $V_{SS}$. The first switch SW1 is configured to switch on or off at least partly in response to an HSTL enable signal from a controller, for example, the controller 501 of FIG. 5. Operation will be described later in connection with FIGS. 8A-9B.

The first resistor R1 includes a first end coupled to the third node N3 and a second end coupled to the fourth node N4. The second resistor R2 includes a first end coupled to the fifth node N5, and a second end coupled to the fourth node N4. The third to sixth transistors TR3-TR6 and the first and second resistors R1, R2 together form a so-called "H-bridge circuit."

The first switch resistor $R_a$ includes a first end coupled to SW1 and a second end coupled to the second node N2. The second switch resistor $R_b$ includes a first end coupled to the sixth node N6 and a second end coupled to switch SW2.

The operational amplifier OPAMP includes a non-inverting input coupled to the fourth node N4, and an inverting input configured to receive a reference signal from the controller. The operational amplifier OPAMP also includes an output coupled to the gate of the first transistor TR1. The operational amplifier OPAMP can be a common mode amplifier which senses the common mode level and sources current through the top of the H-bridge circuit 607, using TR1 for example, such that the voltage at the fourth node N4 is about equal to a common mode reference voltage $V_{cm\_ref}$. The Operational Amplifier OPAMP can form part of a common mode feedback loop that establishes the common mode levels in a certain mode, such as LVPECL and LVDS modes.

The LVDS/LVPECL bias current source control CM1 is configured to receive a LVDS/LVPECL enable signal from the controller and to provide a control signal to the gate of the seventh transistor TR7. In some embodiments the current source control CM1 may be a current mirror. In these embodiments, the current source control CM1 serves to mirror a current through one active device by controlling the current in another active device of a circuit, keeping the output current relatively constant regardless of loading. In some programmable embodiments, the transistor TR7 can sink about 3.5 mA to about 8 mA, for example, 3.5 mA through the bottom of the H-bridge circuit 607. 3.5 mA may be typical for LVDS, whereas 8 mA may be typical for LVPECL Modes. Other applicable values will be readily determined by one of ordinary skill in the art.

The third and fifth nodes N3, N5 are connected to a channel 401 such that component clock signals are outputted therefrom to a component (for example, the components 105a-105e of FIG. 5) via the channel 401. On the component side, there is an external impedance denoted by $R_{ext}$ in FIG. 6. A channel path 401a connecting the third node N3 to the impedance $R_{ext}$ is referred to as $V_{outp}$, and a complementary path 401b from $R_{ext}$ to the fifth node N5 is referred to as $V_{outn}$. Together, $V_{outp}$ and $V_{outn}$ comprise an output signal that can support multi-mode communication with the component (having impedance $R_{ext}$).

In parallel with the component circuit are the first and second resistors R1 and R2, which are electrically in series. The node N4 between these resistors R1, R2 serves to provide a $V_{CM}$ common mode signal, and is coupled to the positive, non-inverting input of operational amplifier OPAMP as part of the feedback configuration. When the driver operates in HSTL mode, as will be described below, the common mode feedback loop is turned off, i.e., the first transistor TR1 is turned off, and the current source control CM1 connected to the seventh transistor TR7 deactivates the seventh transistor TR7.

Figure 7:
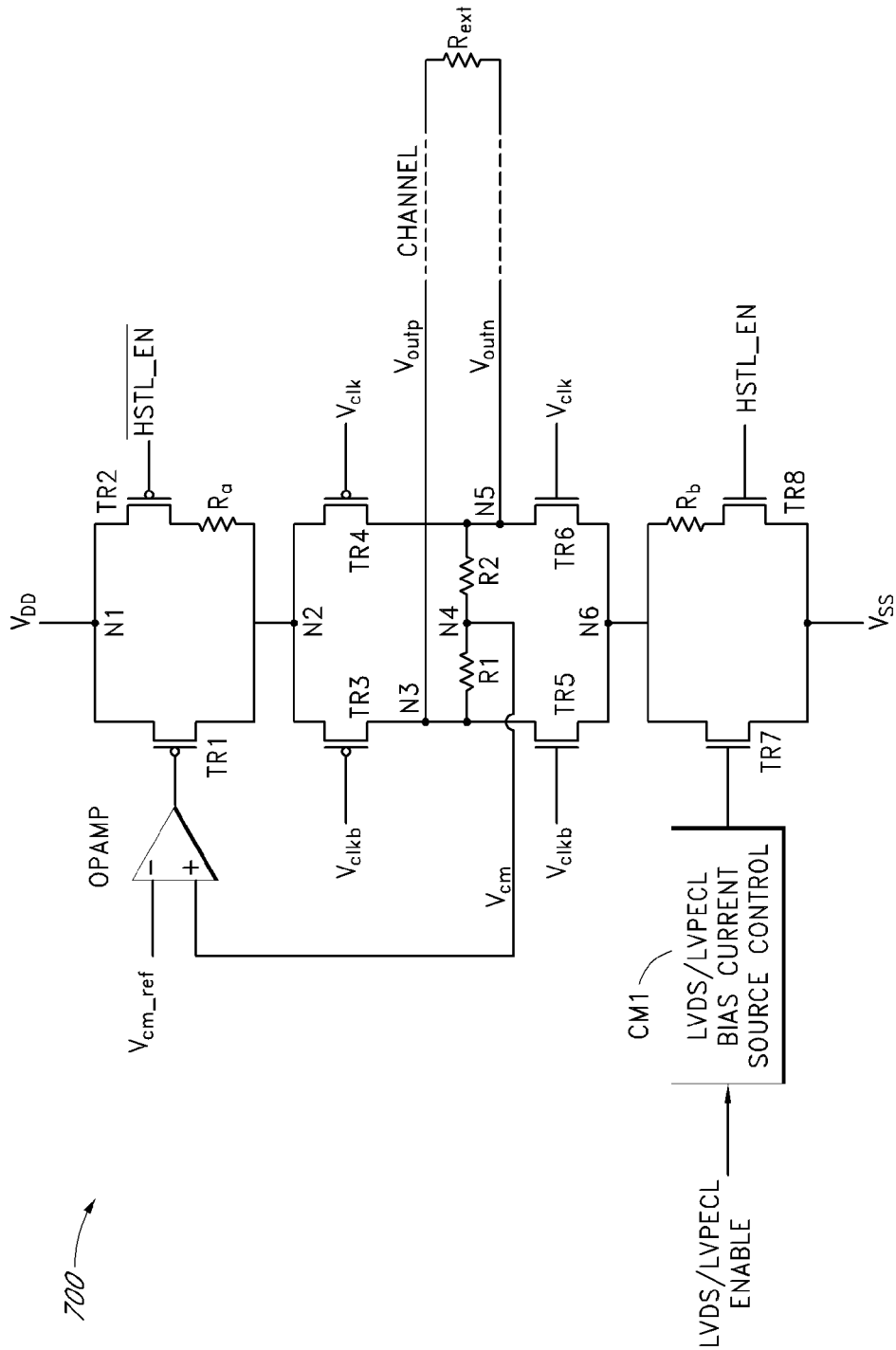
FIG. 7 is a circuit diagram illustrating a driver circuit for a clock generation/distribution device generating multi-mode clock signals according to another embodiment.

Referring to FIG. 7, another embodiment of a multi-mode driver circuit will be described below. The driver circuit 700 is identical to the driver circuit 600 of FIG. 6 except that the first and second switches SW1, SW2 are replaced with second and eighth transistors TR2, TR8. The details of the components of the driver circuit 700, other than those of the second and eight transistor TR2, TR8, can be as described above in connection with FIG. 6.

The second transistor TR2 includes a source/drain coupled to the first voltage source $V_{DD}$, a drain/source coupled to the second node N2, and a gate configured to receive the inverted HSTL enable signal from a controller, for example, the controller 501 of FIG. 5. A skilled artisan will appreciate that the second transistor TR2 can be an PMOS transistor or other types of transistors, depending on the design of the circuit.

The eight transistor TR8 includes a source/drain coupled to the sixth node N6, a drain/source coupled to the second voltage source Vss, and a gate configured to receive the HSTL enable signal from a controller, for example, the controller 501 of FIG. 5. A skilled artisan will appreciate that the second transistor TR2 can be an PMOS transistor or other types of transistors, depending on the design of the circuit.

A skilled artisan will recognize that the switches could be replaced with numerous alternatives, such as bipolar transistors or other types of field effect transistors, or any applicable switching device.

Operation of Multi-Mode Driver Circuit

Referring now to FIGS. 8A-9B the operation of the driver circuit 700 of FIG. 7 according to some embodiments will be described below.

LVDS or LVPECL Mode

Figure 8A:
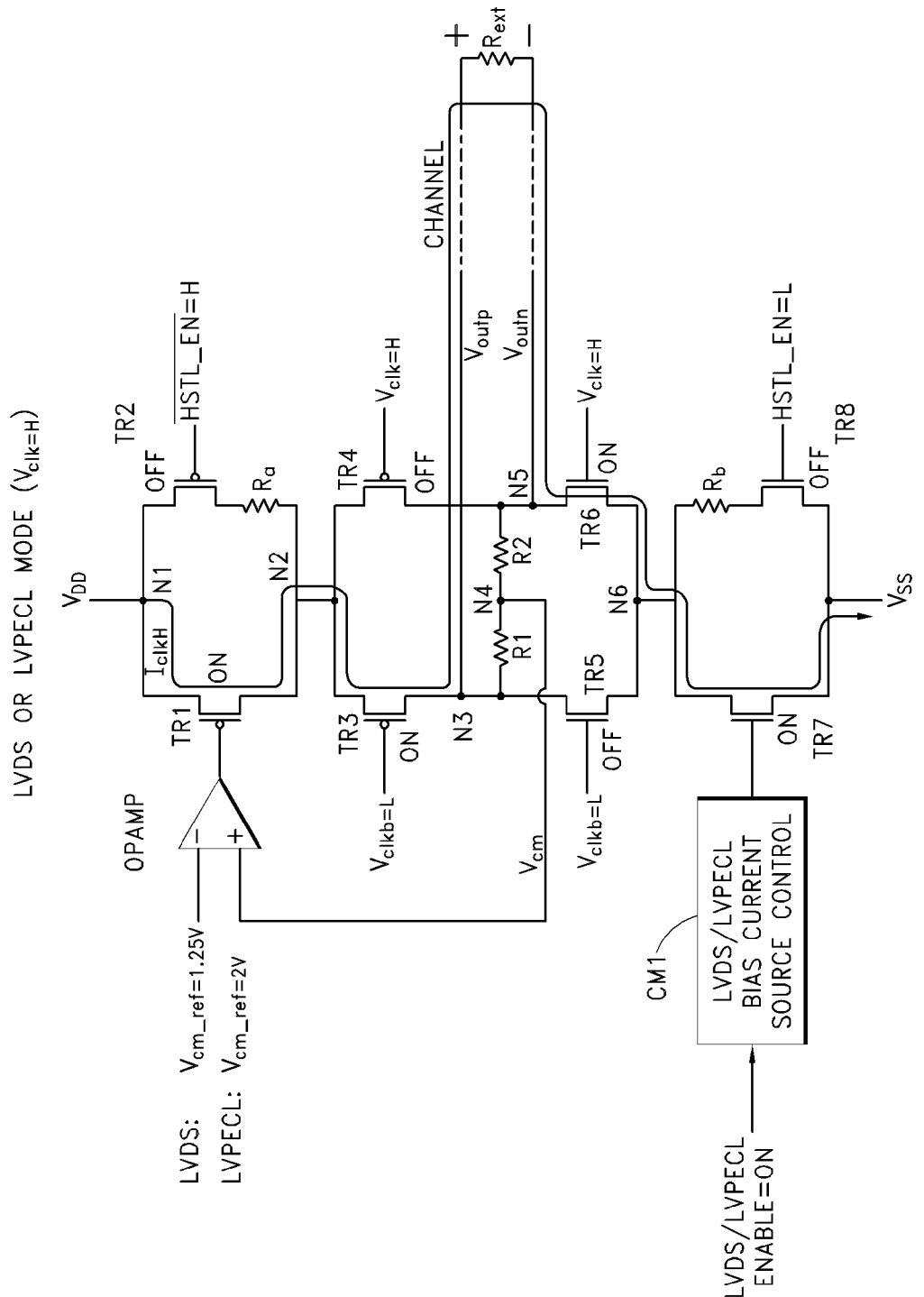
FIGS. 8A and 8B illustrate the operation of the driver circuit of FIG. 7 in LVDS Mode or LVPECL.

FIG. 8A is a circuit diagram illustrating operation of the embodiment of FIG. 7 in LVDS Mode for the state when the clock signal $V_{clk}$ is high. In the illustrated LVDS mode, $V_{cm\_ref}$ can be set to, for example, about 1.25V. For LVPECL operation, $V_{cm\_ref}$ can be set to around 2.0V. During LVDS mode, the first transistor TR1 is turned on. In addition, the LVDS/LVPECL enable signal is high (active high logic) during this mode, and thus the seventh transistor TR7 is turned on to provide a current source. Transistors TR2 and TR8 are off. Accordingly, resistances Ra and Rb will be discussed later In FIG. 8A, when the clock signal $V_{clk}$ is high and the inverted clock signal $V_{clkb}$ is low, the third transistor TR3 and the sixth transistor TR6 are on while the fourth transistor TR4 and the fifth transistor TR5 are off. Thus, a current $I_{clkH}$ (through the load) flows from the first voltage source $V_{DD}$ through the first transistor TR1, the third transistor TR3, the third node N3, the channel path $V_{outp}$, the external impedance $R_{ext}$, the complementary channel path $V_{outn}$, the fifth node N5, the sixth transistor TR6, and the seventh transistor TR7 to the second voltage source $V_{ss}$. Because the combined resistance of the first and second resistors R1, R2 is substantially greater than the impedance of the external impedance $R_{ext}$, most of the current $I_{clkH}$ flows through the external impedance $R_{ext}$.

Figure 8B:
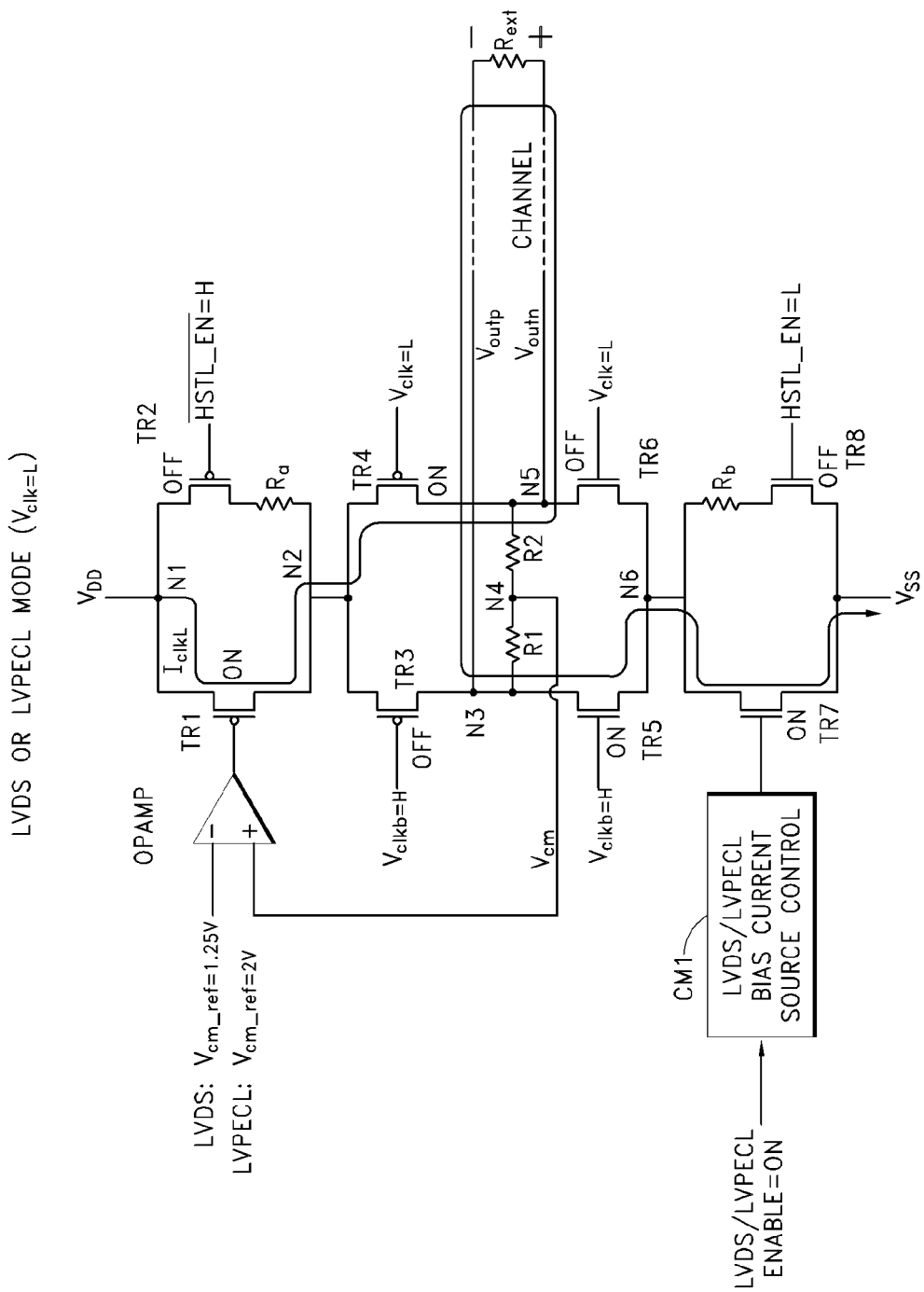

Complementary to FIG. 8A in which $V_{clk}$ was high, FIG. 8B is a circuit diagram illustrating operation of the embodiment of FIG. 7 in LVDS Mode when $V_{clk}$ is low and inverted clock signal $V_{clkb}$ is high. $V_{cm\_ref}$ can again be set to, for example, about 1.25V to facilitate activation of the first transistor TR1. The LVDS/LVPECL enable signal is again high during this mode, and thus the seventh transistor TR7 is turned on.

In FIG. 8B, because the clock signal $V_{clk}$ is low and the inverted clock signal $V_{clkb}$ is high, the third transistor TR3 and the sixth transistor TR6 are off while the fourth transistor TR4 and the fifth transistor TR5 are on. Thus, a current $I_{clkL}$ flows from the first voltage source $V_{DD}$ through the first transistor TR1, the fourth transistor TR4, the fifth node N5, the CHANNEL path via $V_{outn}$, the external impedance $R_{ext}$, the complementary channel path $V_{outp}$, the third node N3, the fifth transistor TR5, and the seventh transistor TR7 to the second voltage source $V_{ss}$.

For LVPECL operation, $V_{cm\_ref}$ can be set to about 2 volts. The operation will then be much the same as in FIGS. 8A and 8B.

HSTL Mode

Figure 9A:
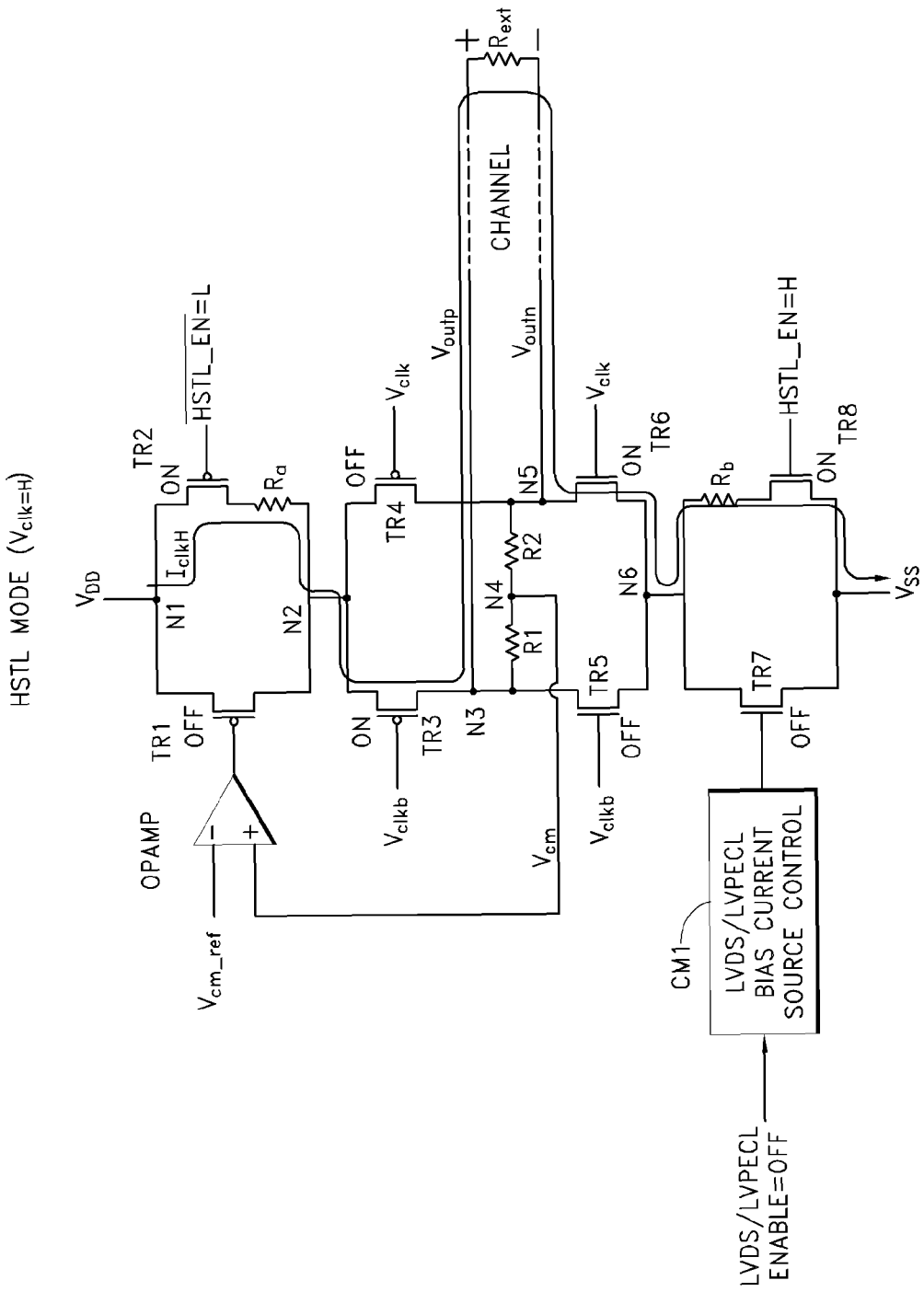
FIGS. 9A and 9B illustrate the operation of the driver circuit of FIG. 7 in HSTL Mode.

FIG. 9A is a circuit diagram illustrating operation of the embodiment of FIG. 7 in HSTL Mode when the clock signal $V_{clk}$ is high. In the illustrated HSTL mode the output of the operational amplifier OPAMP is high, thereby turning off, the first transistor TR1. In some embodiments the output of the OPAMP may simply be of such a nature to render the effect of the first transistor negligible. During the HSTL mode, HSTL_EN is high, rendering the second and eighth transistors TR2 and TR8 active. LVDS/LVPECL ENABLE is low (active high), rendering the seventh transistor TR7 inactive (open circuit).

In FIG. 9A, with the clock signal $V_{clk}$ high and the inverted clock signal $V_{clkb}$ low, the third transistor TR3 and the sixth transistor TR6 are on while the fourth transistor TR4 and the fifth transistor TR5 are off. Thus, a load current $I_{clkH}$ flows from the first voltage source $V_{DD}$ through the second transistor TR2, the resistor Ra, the third transistor TR3, the third node N3, the channel path $V_{outp}$, the external impedance $R_{ext}$, the complementary channel path $V_{outn}$, the fifth node N5, the sixth transistor TR6, the resistor Rb, and the eighth transistor TR7 to the second voltage source $V_{ss}$. Because the combined resistance of the first and second resistors R1, R2 is substantially greater than the impedance of the external impedance $R_{ext}$, most of the current $I_{clkH}$ flows through the external impedance $R_{ext}$. Thus, a current through the first and second resistors R1 and R2 is negligible and ignored for this analysis.

Figure 9B:
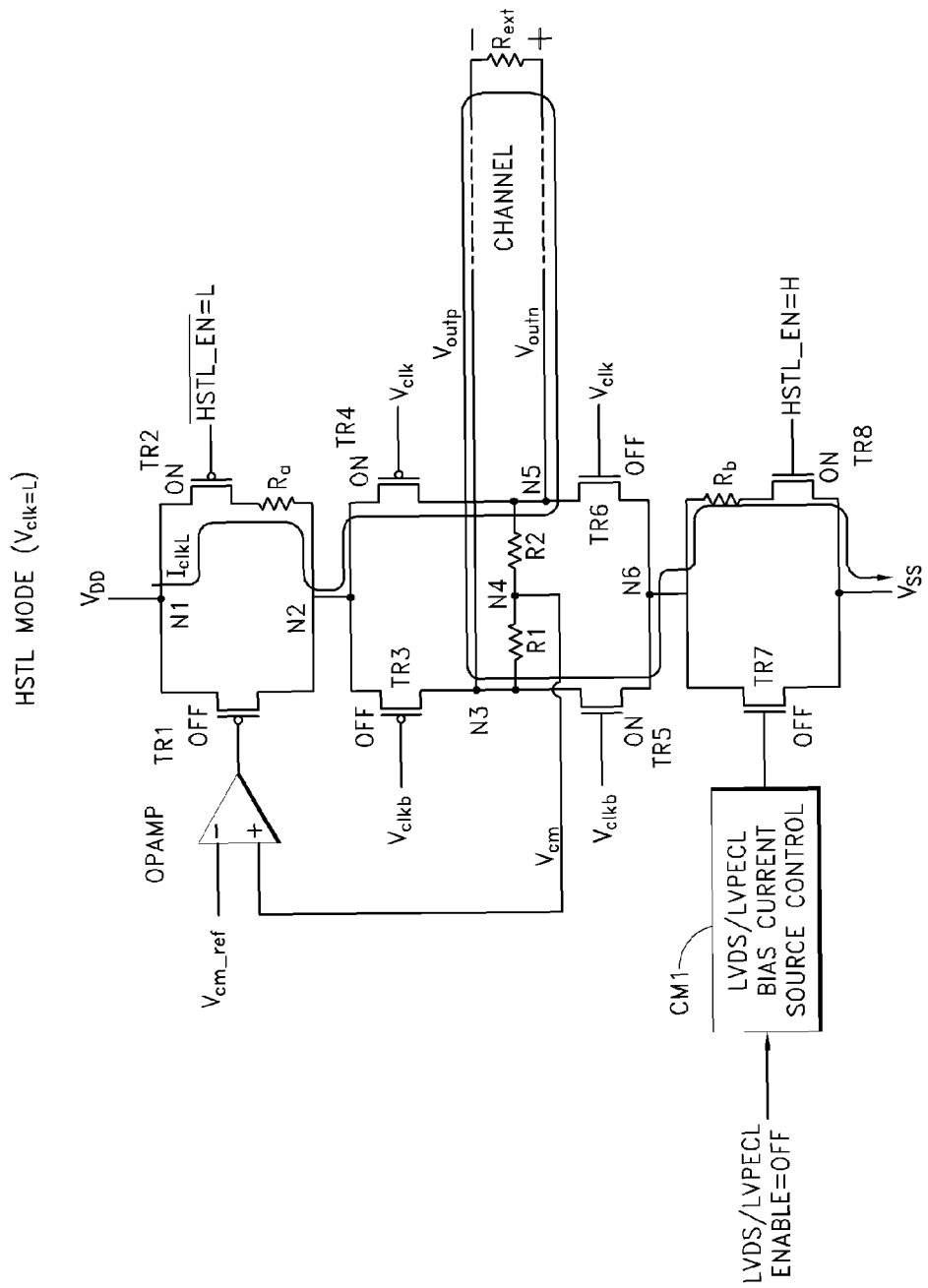

FIG. 9B is a circuit diagram illustrating operation of the embodiment of FIG. 7 in HSTL Mode with the clock signal $V_{clk}$ low. In the illustrated HSTL mode, the first transistor TR1 is turned off. In addition, HSTL_EN is high, rendering the second and eighth transistors TR2 and TR8 active. In contrast, LVDS/LVPECL ENABLE is low, rendering the seventh transistor TR7 inactive.

In FIG. 9B, because the clock signal $V_{clk}$ is low and the inverted clock signal $V_{clkb}$ is high, the third transistor TR3 and the sixth transistor TR6 are off while the fourth transistor TR4 and the fifth transistor TR5 are on. Thus, a current $I_{clkH}$ flows from the first voltage source $V_{DD}$ through the second transistor TR2, resistor $R_a$, the fourth transistor TR4, the fifth node N5, the channel path $V_{outn}$, the external impedance $R_{ext}$, the complementary channel path $V_{outp}$, the third node N3, the fifth transistor TR5, resistor $R_b$ and the eighth transistor TR8 to the second voltage source $V_{ss}$.

In the illustrated embodiment, the second transistor TR2 has a resistance RSW1 when turned on. Each of the third and fourth transistors TR3, TR4 has a resistance Rswp when turned on. In addition, each of the fifth and sixth transistors TR5, TR6 has a resistance Rswn when turned on. The eighth transistor TR8 has a resistance RSW2 when turned on.

Thus, in the HTSL mode described above, an output impedance provided by the driver circuit 600 can be represented as follows.

RSW1+Ra+Rswp+Rswn+Rb+RSW2

In some embodiments, by selecting the sizes of the third to sixth transistors TR3-TR6 and the sizes of the switch resistors $R_a$, $R_b$, the impedance of the driver circuit 600 can be closely matched within about 80% to about 120% of the external impedance $R_{ext}$, which is from about 90 ohms to about 110 ohms.

Alternative Configurations of Multi-Mode Driver Circuits

One skilled in the art will recognize that multiple alternative configurations to the above described circuits are possible. For example, the resistors $R_a$ and $R_b$ of FIGS. 6, 7, 8A-B, or 9A-B may be replaced with variable resistors (e.g., using a digital-to-analog converter (DAC). Such variable resistors can be adjusted to match the impedance of the driver with an external impedance during HSTL mode.

In other embodiments, one or more of the transistor/resistor lines for receiving an HSTL mode enabling signal, for example, TR2/Ra and/or TR8/Rb of FIGS. 6, 7, 8A-B, or 9A-B can be coupled in parallel to one or more additional transistor/resistor lines. In one embodiment, each of such additional transistor/resistor lines can include a transistor having substantially the same size as that of the second or eighth transistor TR2 or TR8, and a resistor having substantially the same resistance as that of the first or second switch resistor Ra, Rb. In another embodiment, such additional transistor/resistor lines can include a transistor having a different size from that of the second or eighth transistor TR2 or TR8, and a resistor having a different resistance from that of the first or second switch resistor Ra, Rb. Each of the transistors of the additional transistor/resistor lines can receive the same or different gate control signal for enabling HSTL mode, depending on the resistance desired by the operation.

Figure 10A:
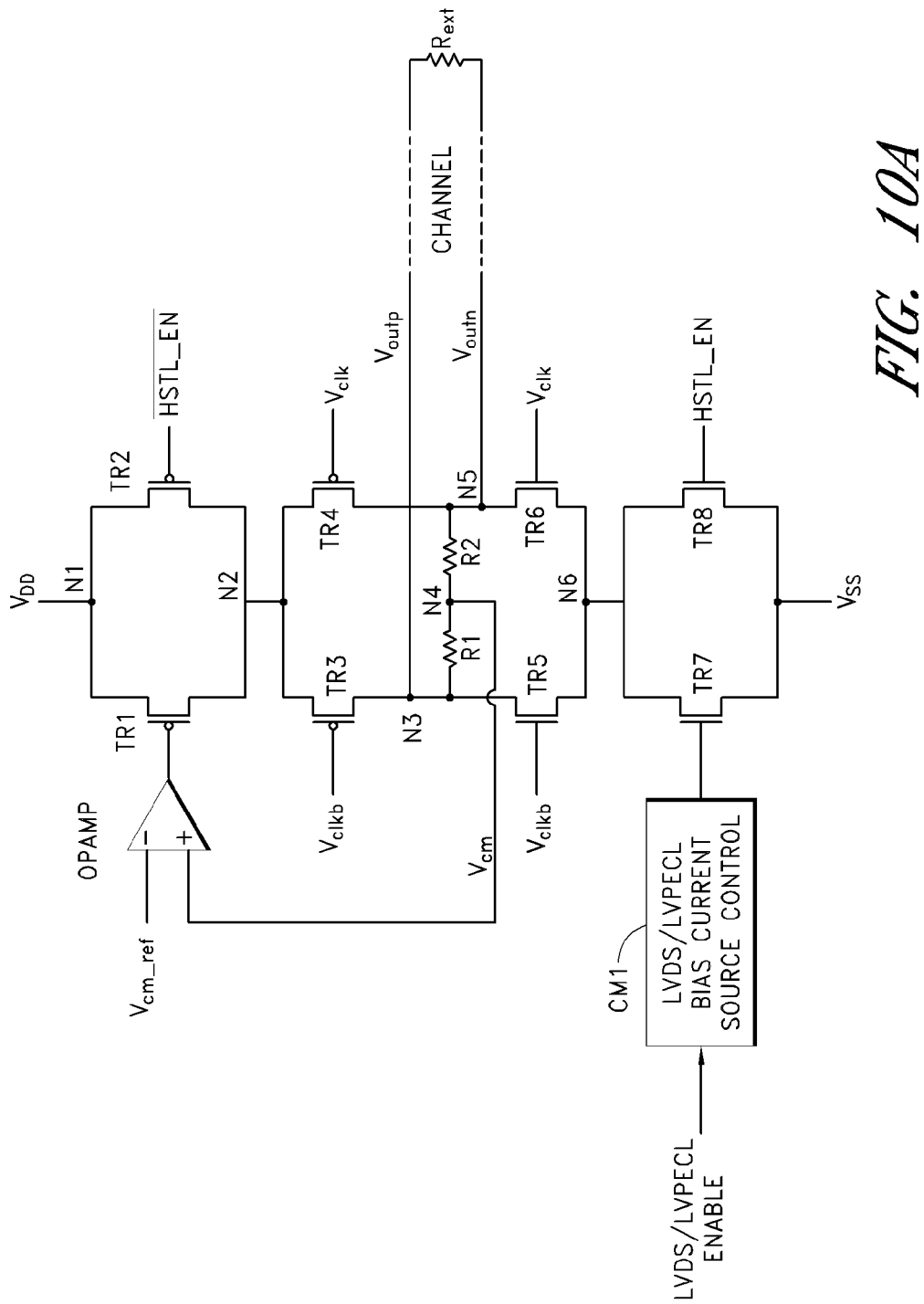
FIG. 10A is a circuit diagram illustrating a driver circuit for a clock generation/distribution device generating multi-mode clock signals according to yet another embodiment.

FIG. 10A is a circuit diagram illustrating another embodiment of a circuit for a multi-mode driver. The configuration of the circuit of FIG. 10A is the same as that of the circuit of FIG. 7 except that the resistors $R_a$ and $R_b$ are removed. The second transistor TR2 and the eighth transistor TR8 alone, in combination with the rest of the circuit, particularly resistors R1 and R2, match the impedance of the driver with an external impedance during HSTL mode.

Figure 10B:
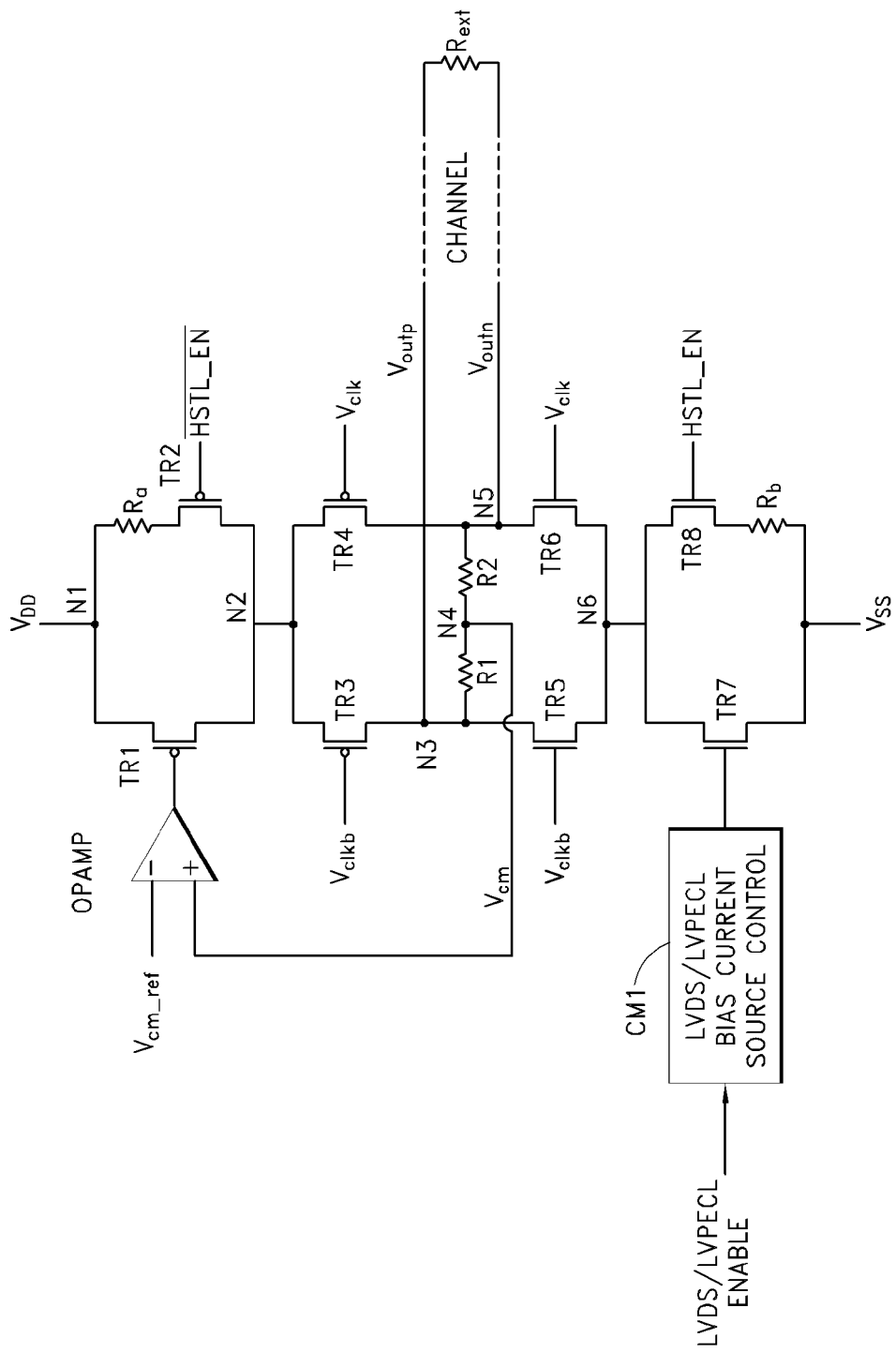
FIG. 10B is a circuit diagram illustrating a driver circuit for a clock generation/distribution device generating multi-mode clock signals according to yet another embodiment.

FIG. 10B is a circuit diagram illustrating yet another embodiment of a circuit for a multi-mode driver. The configuration of the circuit of FIG. 10B is the same as that of the circuit of FIG. 7 except for the positions of resistors Ra, Rb. In the illustrated embodiment, the resistor $R_a$ is coupled between $V_{DD}$ and the second transistor TR2. The resistor $R_b$ is coupled between Vss and the eight transistor TR8. These configurations can match the impedance of the driver with an external impedance during HSTL mode.

Circuit for Multi-Mode Driver for PECL, LVPECL, LVDS, HSTL and CMOS Modes

Figure 11:
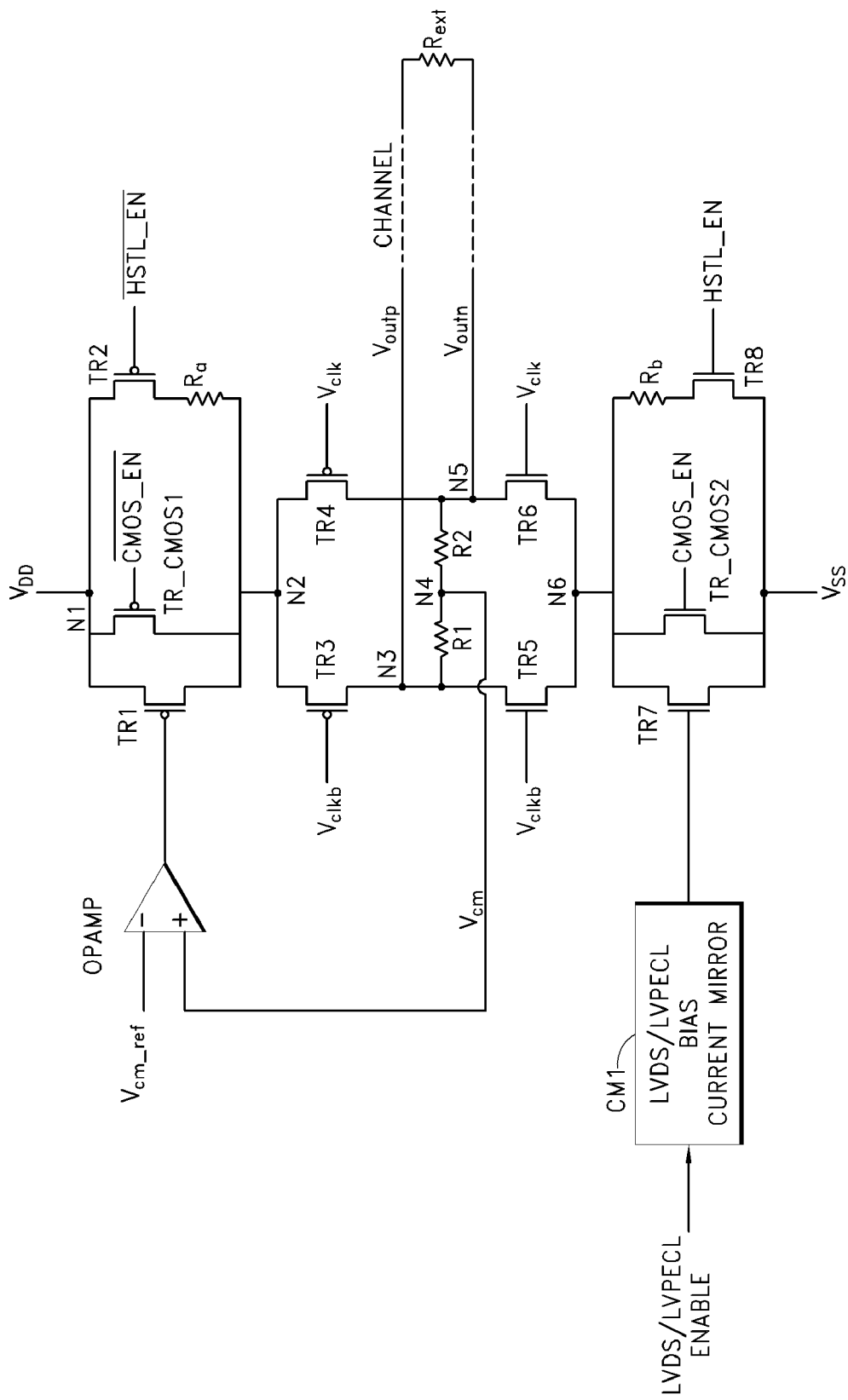
FIG. 11 is a circuit diagram illustrating a driver circuit for a clock generation/distribution device generating multi-mode clock signals according to yet another embodiment.

FIG. 11 is a circuit diagram illustrating a modification of the embodiment of FIG. 7 according to another embodiment. A multi-mode driver having the circuit of FIG. 11 can also provide CMOS operation in addition to PECL, LVPECL, LVDS, and HSTL. In the illustrated circuit, a first CMOS transistor TR_CMOS1 is coupled in parallel with the second transistor TR2 and resistor Ra pair between nodes N1 and N2. Similarly, a second CMOS transistor TR_CMOS2 is coupled in parallel with the eighth transistor TR8, resistor Rb pair between a node N6 and $V_{SS}$. The first CMOS transistor TR_CMOS1 receives an inverted CMOS_EN signal at its gate, while the second CMOS transistor TR_CMOS2 receives CMOS_EN directly at its gate. By pulling HSTL_EN low and bringing CMOS_EN high, clock signals placed on the channel will be the ranges specified in Table 1 for CMOS. One skilled in the art will recognize that transistors TR_CMOS1 and TR_CMOS2 may be generalized to represent any switch.

In other embodiments, each of the circuits shown in FIGS. 6-10B can also be provided with the first and second CMOS transistors, as described above with reference to FIG. 11. The operations of such circuits can be similar to that of the circuit of FIG. 11.

The above embodiments can provide output frequencies in the range of, for example, less than 1 MHz to greater than 1 GHz. A skilled artisan will, however, appreciate that the embodiments are not limited to these frequency ranges.

As used throughout this application, it will be understood that a current source refers to either a current source or a current sink.

Devices employing the above described schemes can be implemented into various electronic devices. Examples of the electronic devices can include, but are not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
an H-bridge configured to receive a first signal and to generate a second signal as an output, the H-bridge comprising a first, second, third, and fourth transistor; and
a current providing circuit configured to supply current to the H-bridge, the current providing circuit having a high impedance current source mode of operation and a low impedance mode of operation;
wherein the first signal switches between a first set of voltage levels, and wherein the second signal switches between a second set of voltage levels, the second set of voltage levels based at least partly on the selected mode of operation of the current providing circuit.

2. The apparatus of claim 1, further comprising:
a fifth transistor coupled between the H-bridge and a first voltage source;
a sixth transistor coupled between the H-bridge and a second voltage source,
an operational amplifier having an output electrically connected to the fifth transistor, the operational amplifier configured to adjust a common mode voltage of the second signal; and
a bias current source control configured to receive as an input a first control signal, wherein the bias current source control is configured to bias the sixth transistor to control current through the H-bridge;
wherein the fifth transistor and the sixth transistor are configured to be in operation for the high impedance current source mode, and are configured to be deactivated for the low impedance mode.

3. The apparatus of claim 1, further comprising:
a first switch in series with a first resistance, the first switch and first resistance coupled between the H-bridge circuit and a first voltage source; and
a second switch in series with a second resistance, the second switch and second resistance coupled between the H-bridge circuit and a second voltage source wherein the first switch and the second switch are configured to be conductive for the low impedance mode and not to be conductive for the high impedance current source mode.

4. The apparatus of claim 1, wherein the first, second, third, and fourth transistors are configured to receive at least one of the first signal or an inverted signal of the first signal.

5. The apparatus of claim 1, wherein the first and second signals are clock signals.

6. An apparatus for processing signals, the apparatus comprising:
an H-bridge comprising a first, second, third, and fourth transistor; and
a means for providing current to the H-bridge in at least one of a high impedance mode or a low impedance mode;
wherein the current providing means is configured such that the high impedance mode is turned off when the low impedance mode is operating, and the low impedance mode is turned off when the high impedance mode is operating;
wherein the H-bridge is configured to receive a first signal and to output a second signal, and wherein the second signal is compliant with a logic standard and the first signal is not compliant with the logic standard, and wherein the logic standard with which the second signal is compliant is based at least partly on a selected mode of operation for the current providing means.

7. The apparatus of claim 6, wherein the high impedance current providing means comprises:
a fifth transistor coupled between the H-bridge and a first voltage source;
a sixth transistor coupled between the H-bridge and a second voltage source;
an operational amplifier configured to amplify a voltage having an output electrically connected to the fifth transistor, wherein the operational amplifier is configured to adjust a common mode voltage of the second signal; and
a bias current source control configured to receive as an input a first control signal, wherein the bias current source control is configured to bias the sixth transistor and control current through the H-bridge.

8. The apparatus of claim 7, wherein the bias current source control is configured to receive as input a second control signal, the second control signal determining, at least in part, whether the second signal comprises characteristics in compliance with the LVDS or the LVPECL logic standards.

9. The apparatus of claim 7, wherein the sixth transistor is in parallel with a seventh transistor, the seventh transistor configured to receive a first control signal, and wherein the fifth transistor is in parallel with an eighth transistor, the eighth transistor configured to receive a second control signal, the first and second control signal determining, at least in part, whether the second signal comprises characteristics in compliance with the HSTL logic standard.

10. The apparatus of claim 6, wherein the current providing means is configured to receive as input a first control signal, the first control signal determining, at least in part, whether the second signal comprises characteristics in compliance with the LVDS or the LVPECL logic standards.

11. The apparatus of claim 6, wherein the low impedance current providing means comprises:
a first switch a coupled between the H-bridge circuit and a first voltage source, the first switch configured to receive a control signal, the control signal determining, at least in part, whether the second signal comprises characteristics in compliance with the HSTL logic standard; and
a second switch coupled between the H-bridge circuit and a second voltage source, the second switch configured to receive a control signal, the control signal determining at least in part, whether the second signal comprises characteristics in compliance with the HSTL logic standard.

12. The apparatus of claim 6, wherein the first, second, third, and fourth transistors receive one of the first signal or an inverted signal of the first signal.

13. The apparatus of claim 6, wherein the first and second signals are clock signals.

14. A method of processing a signal, the method comprising:
   providing an H-bridge, the H-bridge comprising a first, second, third, and fourth transistor;
   providing current through the H-bridge with a current providing circuit, the current providing circuit having a high impedance mode of operation and a low impedance mode of operation, the current providing circuit comprising a high impedance current source and a low impedance current source;
   in the high impedance mode, activating the high impedance current source and deactivating the low impedance current source;
   in the low impedance mode, activating the low impedance current source and deactivating the high impedance current source; and
   using the H-bridge to receive a first signal and to generate a second signal, wherein levels of the second signal are based at least partly on the selected mode of operation for the current providing circuit.

15. The method of claim 14, wherein the first, second, third, and fourth transistors are configured to receive one of the first signal or an inverted signal of the first signal.

16. The method of claim 14, wherein the high impedance mode of operation further comprises:
   providing a bias current source control electronically connected to a fifth transistor, the fifth transistor coupled between the H-bridge and a first voltage source;
   providing an operational amplifier having an output electrically connected to a sixth transistor, the sixth transistor coupled between the H-bridge and a second voltage source;
   controlling current through the H-bridge using the bias current source control; and
   adjusting a common mode voltage of an output of the H-bridge with the operational amplifier.

17. The method of claim 16, further comprising receiving a first control signal as an input to the operational amplifier, the first control signal determining, at least in part, whether the second signal comprises characteristics in compliance with the LVDS or the LVPECL logic standards.

18. The method of claim 17, further comprising receiving a second control signal as an input to the bias current source, the second control signal determining, at least in part, whether the second signal comprises characteristics in compliance with the LVDS or the LVPECL logic standards.

19. The method of claim 16, wherein a series combination of a first switch and a first resistor are in parallel with the fifth transistor, further comprising receiving a control signal as an input to the first switch, the control signal determining, at least in part, whether the second signal comprises characteristics in compliance with the HSTL logic standard.

20. The method of claim 16, wherein a series combination of a second switch and a second resistor are in parallel with the sixth transistor, further comprising receiving a control signal as an input to the second switch, the control signal determining, at least in part, whether the second signal comprises characteristics in compliance with the HSTL logic standard.

21. The method of claim 14, wherein the first and second signals are clock signals.

* * * * *